United States Patent
Fricke et al.

(10) Patent No.: US 6,818,549 B2
(45) Date of Patent: Nov. 16, 2004

(54) BURIED MAGNETIC TUNNEL-JUNCTION MEMORY CELL AND METHODS

(75) Inventors: Peter J. Fricke, Corvallis, OR (US); Andrew Koll, Albany, OR (US); Andrew L. Van Brocklin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/382,673

(22) Filed: Mar. 5, 2003

(65) Prior Publication Data

US 2004/0175847 A1 Sep. 9, 2004

(51) Int. Cl.[7] .......................................... H01L 21/8239
(52) U.S. Cl. ........................ 438/629; 438/3; 438/631; 438/637; 438/669; 438/680; 438/700; 438/753
(58) Field of Search ........................... 438/3, 629, 631, 438/637, 669, 680, 691, 700, 760, 753, 959, FOR 187, FOR 388, 645, 763

(56) References Cited

U.S. PATENT DOCUMENTS

| | | |
|---|---|---|
| 5,640,343 A | 6/1997 | Gallagher et al. |
| 5,768,181 A | 6/1998 | Zhu et al. |
| 5,940,319 A | 8/1999 | Durlam et al. |
| 6,083,764 A | 7/2000 | Chen |
| 6,110,751 A | 8/2000 | Sato et al. |
| 6,169,686 B1 | 1/2001 | Brug et al. |
| 6,242,770 B1 | 6/2001 | Bronner et al. |
| 6,266,218 B1 | 7/2001 | Carey et al. |
| 6,292,389 B1 | 9/2001 | Chen et al. |
| 6,331,944 B1 | 12/2001 | Monsma et al. |
| 6,385,074 B1 | 5/2002 | Johnson et al. |
| 6,429,497 B1 | 8/2002 | Nickel |
| 6,555,858 B1 * | 4/2003 | Jones et al. .................. 257/295 |
| 2001/0010938 A1 | 8/2001 | Bronner et al. |
| 2001/0036699 A1 | 11/2001 | Slaughter |
| 2002/0003721 A1 | 1/2002 | Brug et al. |
| 2002/0093845 A1 | 7/2002 | Matsuoka et al. |
| 2002/0142490 A1 | 10/2002 | Sato et al. |
| 2002/0145902 A1 | 10/2002 | Kunikiyo |
| 2002/0145905 A1 | 10/2002 | Hirai |
| 2002/0153580 A1 | 10/2002 | Hosotani et al. |
| 2003/0086313 A1 * | 5/2003 | Asao ........................... 365/200 |
| 2003/0133323 A1 * | 7/2003 | Nejad ........................... 365/158 |
| 2003/0146515 A1 * | 8/2003 | Kajiyama .................... 257/758 |
| 2003/0183867 A1 * | 10/2003 | Fricke et al. ................ 257/314 |
| 2003/0183868 A1 * | 10/2003 | Fricke et al. ................ 257/314 |
| 2003/0185033 A1 * | 10/2003 | Fricke et al. ................. 365/63 |
| 2003/0185034 A1 * | 10/2003 | Fricke et al. ................. 365/63 |
| 2003/0223283 A1 * | 12/2003 | Kunikiyo .................... 365/200 |

* cited by examiner

Primary Examiner—George Fourson
Assistant Examiner—Joannie Adelle Garcia

(57) ABSTRACT

A magnetic memory cell made on a substrate has a first metal conductor, a first magnetic layer disposed on the first metal conductor, a planar interlayer dielectric (ILD) having a via opening extending through it to the first magnetic layer, a buried tunnel junction over the first magnetic layer within the via opening, a second magnetic layer filling the via opening and burying the tunnel junction, and a second metal conductor coupled to the second magnetic layer. Methods for using the memory cell in memories and other devices and methods specially adapted for fabrication of the memory cell are disclosed.

29 Claims, 5 Drawing Sheets

BURIED MAGNETIC TUNNEL-JUNCTION MEMORY CELL AND METHODS

TECHNICAL FIELD

This invention relates to magnetic tunnel-junction devices and more particularly to information storage devices such as magnetic random access memory ("MRAM") devices incorporating buried magnetic tunnel-junction devices, and to methods for making and using such devices.

BACKGROUND

A typical MRAM device includes an array of memory cells, word lines extending along rows of the memory cells, and bit lines extending along columns of the memory cells. Each memory cell is located at a cross point of a word line and a bit line. In one type of MRAM device, each memory cell includes a tunnel junction such as a spin-dependent tunneling ("SDT") junction. The magnetization of an SDT junction assumes one of two stable orientations at any given time. These two stable magnetic orientations, parallel and anti-parallel, represent logic values of "0" and "1." The magnetization orientation, in turn, affects the resistance of the SDT junction. Resistance of the SDT junction has a first value ($R_p$) if the magnetization orientation is parallel and has a higher second value ($R_a$) if the magnetization orientation is anti-parallel. The magnetization orientation of a SDT junction and, therefore, its logic state may be read by sensing its resistance state. MRAM integrated circuits using magnetic tunnel junctions can provide nonvolatile information storage especially useful in extending the applications of CMOS integrated circuit technology.

Defective SDT junctions can be created during manufacture by various mechanisms, such as electrostatic discharges, handling errors, and circuit anomalies such as voltage spikes. Each defective SDT junction can cause a bit error. In a crosspoint MRAM array that does not use transistor switches or diodes to isolate memory cells from one another, a short-circuited SDT junction can also render other memory cells in the same column and row unusable. Thus, a single shorted SDT junction can cause column-wide and row-wide errors as well. When data is read back from the MRAM device, error correcting codes (ECC) may be used to recover data from complete rows and columns of unusable SDT junctions. However, ECC for a thousand or more bits in a single column or row is costly, both from a time standpoint and a computational standpoint. Moreover, an MRAM device is likely to have more than one shorted SDT junction. If an MRAM device contains many unusable SDT junctions, that device is rejected at the manufacture stage. Thus, electrostatic discharge, handling errors, and circuit anomalies can reduce manufacturing yield. Prevention of damage from these mechanisms is expensive and difficult to implement.

The use of transistor switches or isolating diodes to isolate memory cells from one another is known in the art, but such devices increase complexity and are typically larger than the minimum attainable geometry and thus limit the size of memory cell arrays.

Improved isolation of magnetic tunnel-junction memory cells is needed, and magnetic tunnel-junction memory cells that can be manufactured by relatively simple processes with diminished incidence of junction defects are especially desirable.

BRIEF DESCRIPTION OF THE DRAWINGS

The features and advantages of the disclosure will readily be appreciated by persons skilled in the art from the following detailed description when read in conjunction with the drawings, wherein.

For clarity of the description, the drawings are not drawn to a uniform scale. In particular, vertical and horizontal scales may differ from each other and may vary from one drawing to another.

DETAILED DESCRIPTION OF EMBODIMENTS

In the following detailed description, a number of embodiments of magnetic memory cells made in accordance with the invention are described and illustrated, along with memories incorporating them. In a memory embodiment made in accordance with the invention, row conductors and column conductors form an orthogonal set of wiring channels, and individual memory cells are addressed by a combination of a row conductor, e.g., a word line, and a column conductor, e.g., a bit line. It will be recognized by those skilled in the art that the assignment of row conductors as word lines and column conductors as bit lines is arbitrary, and other assignments may be made instead. Similarly, the assignments of conductors as row or column conductors may be varied. In the following descriptions, the designations of row and column conductors may be interchanged throughout.

In the embodiments illustrated, a magnetic memory cell made on a substrate has a first metal conductor, a first ferromagnetic layer disposed on the first metal conductor, a planar interlayer dielectric (ILD) having a via opening extending through it to the first ferromagnetic layer, a buried tunnel junction over the first ferromagnetic layer within the via opening, a second ferromagnetic layer filling the via opening and burying the tunnel junction, and a second metal conductor coupled to the second ferromagnetic layer. A memory such as a cross-point memory comprising an array of such magnetic tunnel-junction memory cells may be made.

Figure 1:
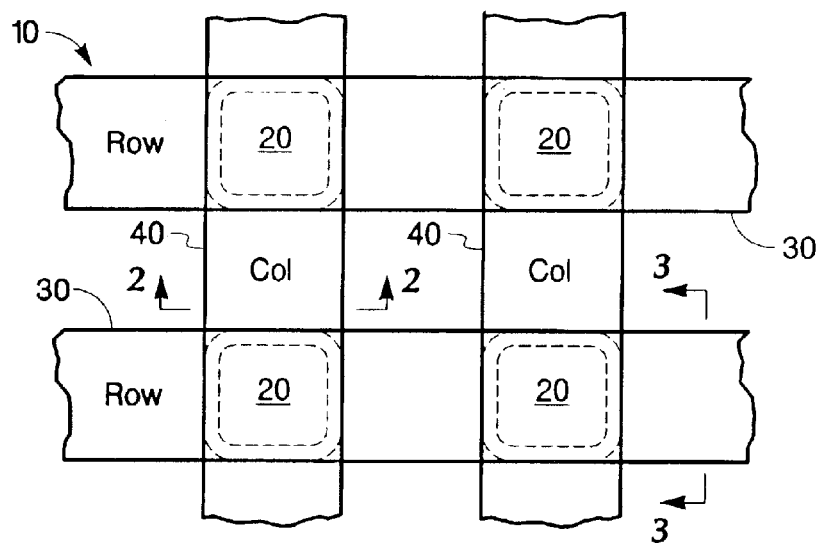
FIG. 1 is a top plan view of an embodiment of a crosspoint memory.

FIG. 1 shows a top plan view of an embodiment of a crosspoint memory array 10 having memory cells 20 at the intersections of row lines 30 and column lines 40. For example, traces functioning as word lines may extend along the x-direction in a plane on one side of the crosspoint memory cell array 10. Traces functioning as bit lines may extend along the y-direction in a plane on an opposite side of the memory cell array 10. There may be one word line for each row of the array and one bit line for each column of the array. While only a few memory cells, row conductors, and column conductors are shown in FIG. 1, it will be understood that memory cell array 10 may consist of many such elements, and the arrangement depicted schematically in FIG. 1 may be extended both in the two directions (e.g., along conventional x- and y-axes parallel to each plane) and along a z-axis perpendicularly to other similar planes, i.e., having multiple planes.

Expressed in general language, one aspect of the invention includes a magnetic tunnel-junction memory cell which performs a combination of functions: storing a bit of information in a ferromagnetic layer, switching the bit of information with a tunnel junction, and controlling the tunnel junction. The tunnel junction is coupled with the magnetic information storage element and may be buried under the ferromagnetic layer. In particular, the ferromagnetic layer may be formed directly over the tunnel junction to prevent intervening process steps from affecting the tunnel-junction.

A memory cell having a magnetic storage element and a tunnel-junction sensing element may be used in a cross-point memory structure having column lines and row lines as shown in FIG. 1, by coupling a first line of the row and column lines to a ferromagnetic material disposed to form the storage element of each memory cell, coupling the remaining line of the row and column lines to a buried tunnel junction under the ferromagnetic material (thereby forming the sensing element of each memory cell), and controlling each sensing element to selectively sense the state of the ferromagnetic material at a selected row-column combination. Also, a second tunnel junction buried under a second ferromagnetic material (thereby forming an integrated control element) may be controlled to selectively switch the state of the ferromagnetic material at a selected row-column combination.

Figure 2:
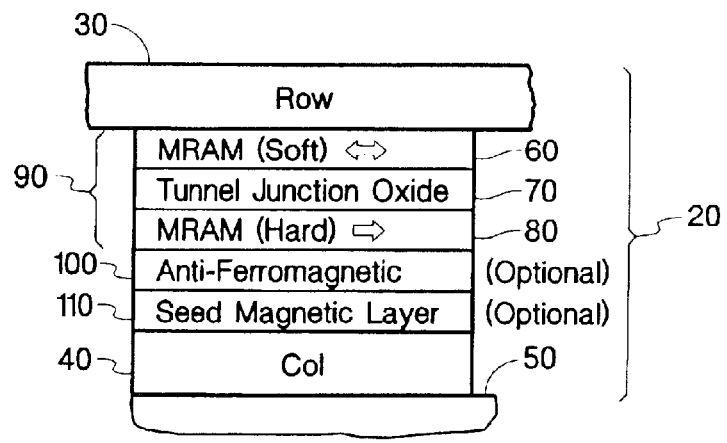
FIGS. 2 and 3 are cross-sectional side elevation views of an embodiment of a memory cell.
Figure 3:
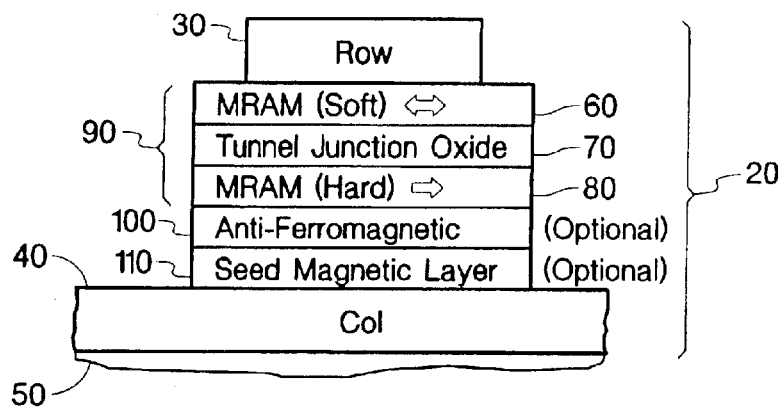

FIGS. 2 and 3 are cross-sectional side elevation views of a typical embodiment of a row-column aligned memory cell 20 built up on a substrate 50. Substrate 50 has an insulating surface, such as a layer of oxide or glass on a silicon wafer. As shown in FIGS. 2 and 3, each memory cell 20 of this embodiment is formed between row line 30 and column line 40. Each memory cell includes a layer of soft ferromagnetic material 60 separated from a layer of hard ferromagnetic material 80 by a thin tunnel-junction oxide layer 70. (Here, "soft" has its conventional meaning in this context, referring to a magnetic material relatively easy to reverse in magnetization direction, and "hard" refers to a magnetic material relatively difficult to reverse in magnetization direction.)

The three-layer structure of soft ferromagnetic material 60, tunnel-junction oxide layer 70, and hard ferromagnetic material 80 forms a magnetic tunnel junction 90. The arrows in FIGS. 2 and 3 schematically indicate magnetic fields. Optionally, the anti-ferromagnetic (AF) pinning layer 100 and seed magnetic layer 110 shown in FIGS. 2 and 3 may be included. The MRAM vertical cell structures shown in FIGS. 2 and 3 may be formed without employing the present invention.

Figure 4:
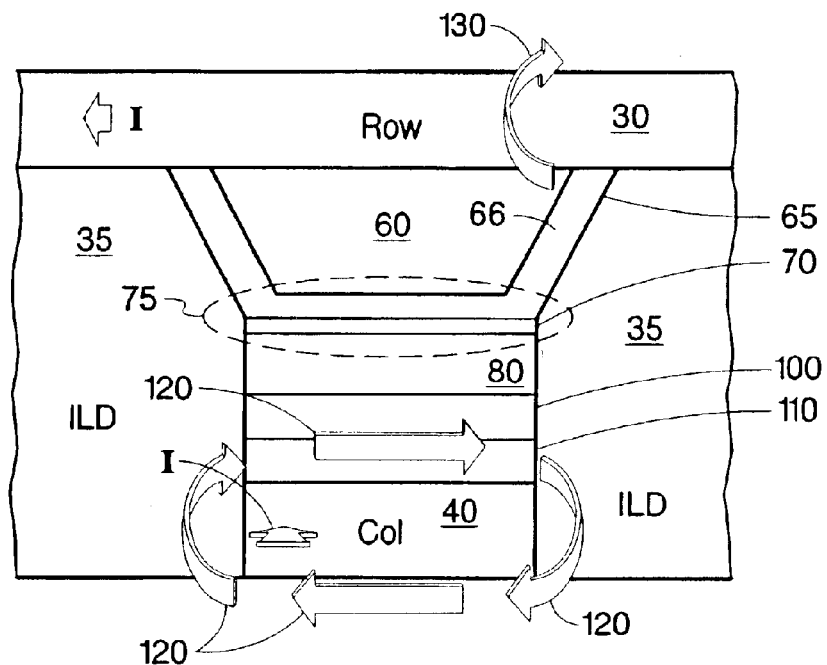
FIGS. 4 and 5 are cross-sectional side elevation views of a portion of a first embodiment of a memory made in accordance with the invention.
Figure 5:
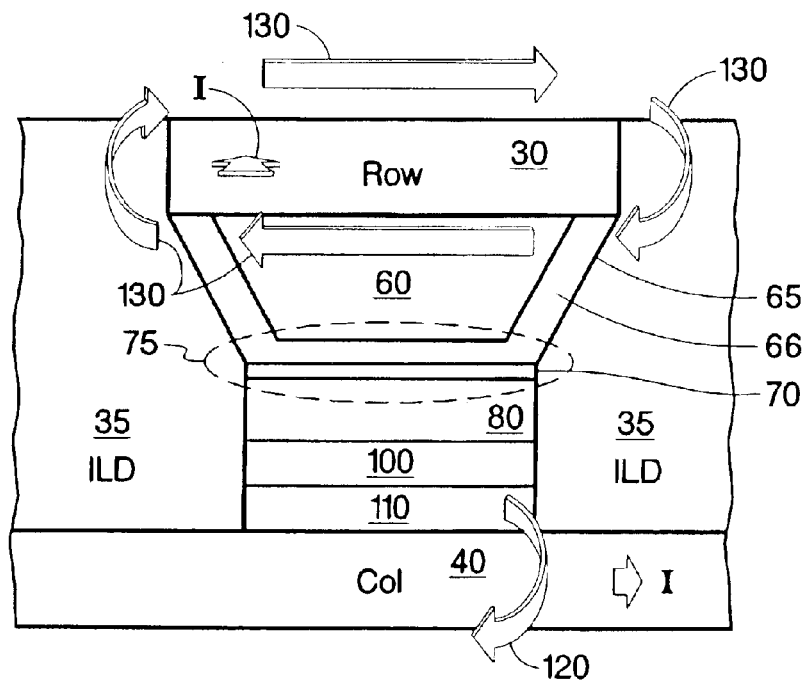

FIGS. 4 and 5 are cross-sectional side elevation views of a portion of a first embodiment of a memory made in accordance with the invention, as viewed from two orthogonal directions. As shown in FIGS. 4 and 5, the memory cell has a first metal layer patterned to form a column conductor line 40. The column conductor 40 is formed on a suitable insulating substrate 50 (not shown in FIGS. 4 and 5). In the remainder of this specification, a suitable substrate 50 underlying each of the memory cell structure embodiments is assumed and is not shown in the memory cell drawings. A first ferromagnetic layer 80 lies over the first metal conductor, whereby the first metal conductor (column conductor 40) is coupled to first ferromagnetic layer 80. A planar interlayer dielectric (ILD) 35 over column conductor 40 has a via opening 65 extending through it. In the embodiment illustrated, via opening 65 has sloped sidewalls. The via opening is at least partially aligned with the first metal conductor (column conductor 40). A tunnel junction 75 extends over at least a portion of first ferromagnetic layer 80 within the via opening. The region of tunnel junction 75 is indicated by a dashed ellipse in FIGS. 4 and 5. Tunnel junction 75 is formed by thin tunnel-junction oxide layer 70 on the top surface of first ferromagnetic layer 80. Optionally, a metal electrode 66 may cover tunnel junction 75 to form a top electrode for tunnel junction 75 (as shown in FIGS. 4 and 5). Metal electrode 66 may also cover the side walls of via opening 65, as shown. A second ferromagnetic layer 60 fills the via opening and buries tunnel junction 75. If optional metal electrode 66 is omitted, ferromagnetic layer 60 may act as a top electrode for tunnel junction 75. A second metal layer, patterned to form row conductor 30, is at least partially aligned with the via opening filled with second ferromagnetic layer 60, whereby the second metal conductor (row conductor 30) is coupled to second ferromagnetic layer 60.

In FIG. 4, arrows 120 show the direction of magnetic field due to current I flowing in the direction of the short arrow in column conductor 40 (into the plane of the drawing), and curved arrow 130 shows the direction of magnetic field due to current I flowing in the direction of the short arrow in row conductor 30 (parallel to the plane of the drawing and toward the left). Similarly, in FIG. 5, arrows 130 show the direction of magnetic field due to current I flowing in the direction of the short arrow in row conductor 30 (into the plane of the drawing), and curved arrow 120 shows the direction of magnetic field due to current I flowing in the direction of the short arrow in column conductor 40 (parallel to the plane of the drawing and toward the right). Also shown in FIGS. 4 and 5 are the optional layers, seed magnetic layer 110 over the first metal layer and anti-ferromagnetic (AF) pinning layer 100 over the seed magnetic layer.

Figure 6:
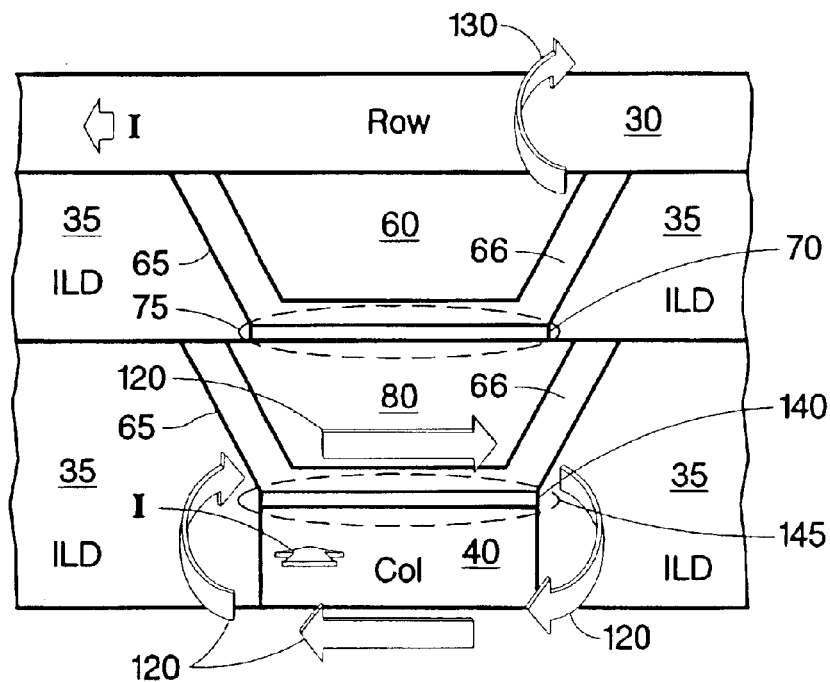
FIGS. 6 and 7 are cross-sectional side elevation views of a portion of a second embodiment of a memory made in accordance with the invention.
Figure 7:
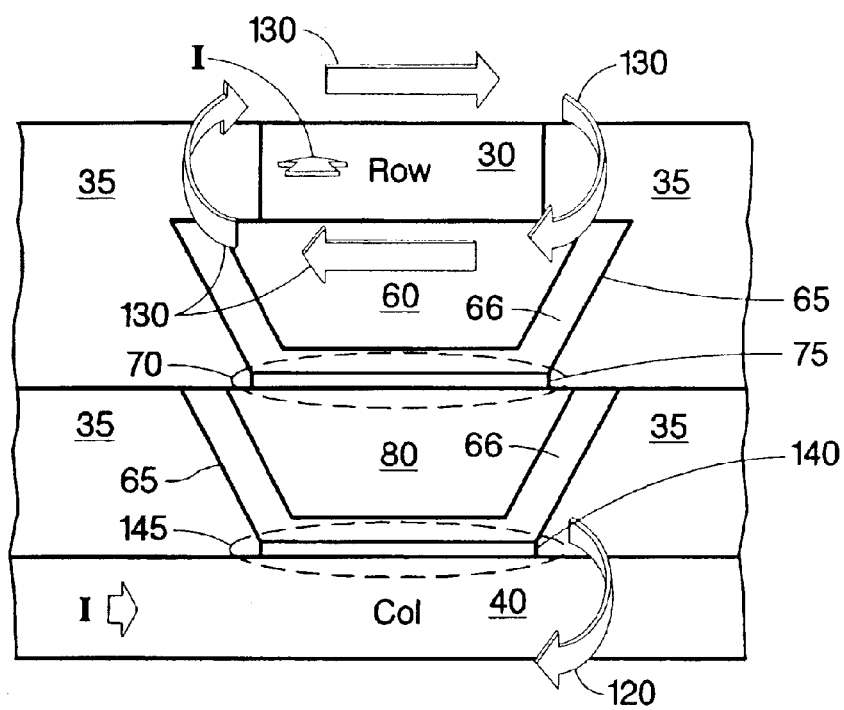

FIGS. 6 and 7 are cross-sectional side elevation views of a portion of a second embodiment of a memory made in accordance with the invention, as viewed from two orthogonal directions. Again, a suitable insulating substrate 50 is assumed underlying the memory cell embodiment and is not shown in the memory cell drawings. As shown in FIGS. 6 and 7 the memory cell has a first metal layer patterned to form a first metal conductor (column conductor 40) on the substrate. A planar first interlayer dielectric (ILD) 35 over column conductor 40 has a first via opening 65 extending through it. First via opening 65 is at least partially aligned with column conductor 40. A first tunnel junction 145 (formed by thin tunnel-junction oxide layer 140 on the top surface of column conductor 40) extends over at least a portion of column conductor 40 within the first via opening. Optionally, a metal electrode 66 may cover tunnel junction 145 to form a top electrode for tunnel junction 145 (as shown in FIG. 6). Metal electrode 66 may also cover the side walls of via opening 65, as shown. A first ferromagnetic layer 80 fills first via opening 65 and buries first tunnel junction 145. If optional metal electrode 66 is omitted, ferromagnetic layer 80 may act as a top electrode for tunnel junction 145. A planar second interlayer dielectric (ILD) 35 over first ferromagnetic layer 80 has a second via opening 65 extending through it. The second via opening 65 is at least partially aligned with the first via opening 65 that is filled with the first ferromagnetic layer 80. A second tunnel junction 75 within the second via opening extends over at least a portion of first ferromagnetic layer 80. Second tunnel junction 75 is formed by thin tunnel-junction oxide layer 70 on the top surface of first ferromagnetic layer 80. A second ferromagnetic layer 60 fills the second via opening and buries second tunnel junction 75. A second metal layer is patterned to form a second metal conductor (row conductor 30) in at least partial alignment with the second via opening 65 filled with second ferromagnetic layer 60, whereby row conductor 30 is coupled to second ferromagnetic layer 60. While not shown in FIGS. 6 and 7, the optional layers may be included directly under the first and/or second ferromagnetic layers, e.g., seed magnetic layer 110 over the first metal layer and anti-ferromagnetic (AF) pinning layer 100 over the seed magnetic layer.

In FIG. 6, arrows 120 show the direction of magnetic field due to current I flowing in the direction of the short arrow in column conductor 40 (into the plane of the drawing), and curved arrow 130 shows the direction of magnetic field due to current I flowing in the direction of the short arrow in row conductor 30 (parallel to the plane of the drawing and toward the left). Similarly, in FIG. 7, arrows 130 show the direction of magnetic field due to current I flowing in the direction of the short arrow in row conductor 30 (into the plane of the drawing), and curved arrow 120 shows the direction of magnetic field due to current I flowing in the direction of the short arrow in column conductor 40 (parallel to the plane of the drawing and toward the right).

It will be understood by those skilled in the art that a memory may be made by forming an array of memory cells and that a multilayer memory may be made by forming several layers of memory cell arrays stacked in a vertical direction (with interlayer dielectrics (ILD's) interposed between layers if necessary). For the second and subsequent layers of a multilayer memory, the insulating substrate is provided by an interlayer dielectric (ILD) formed over the previous layer.

A multilayer memory made in accordance with the invention may be used in a mass storage device and may be fabricated in the form of an integrated circuit, as a substrate carrying microelectronics, and/or incorporated in an electronic device.

Fabrication

Figure 8:
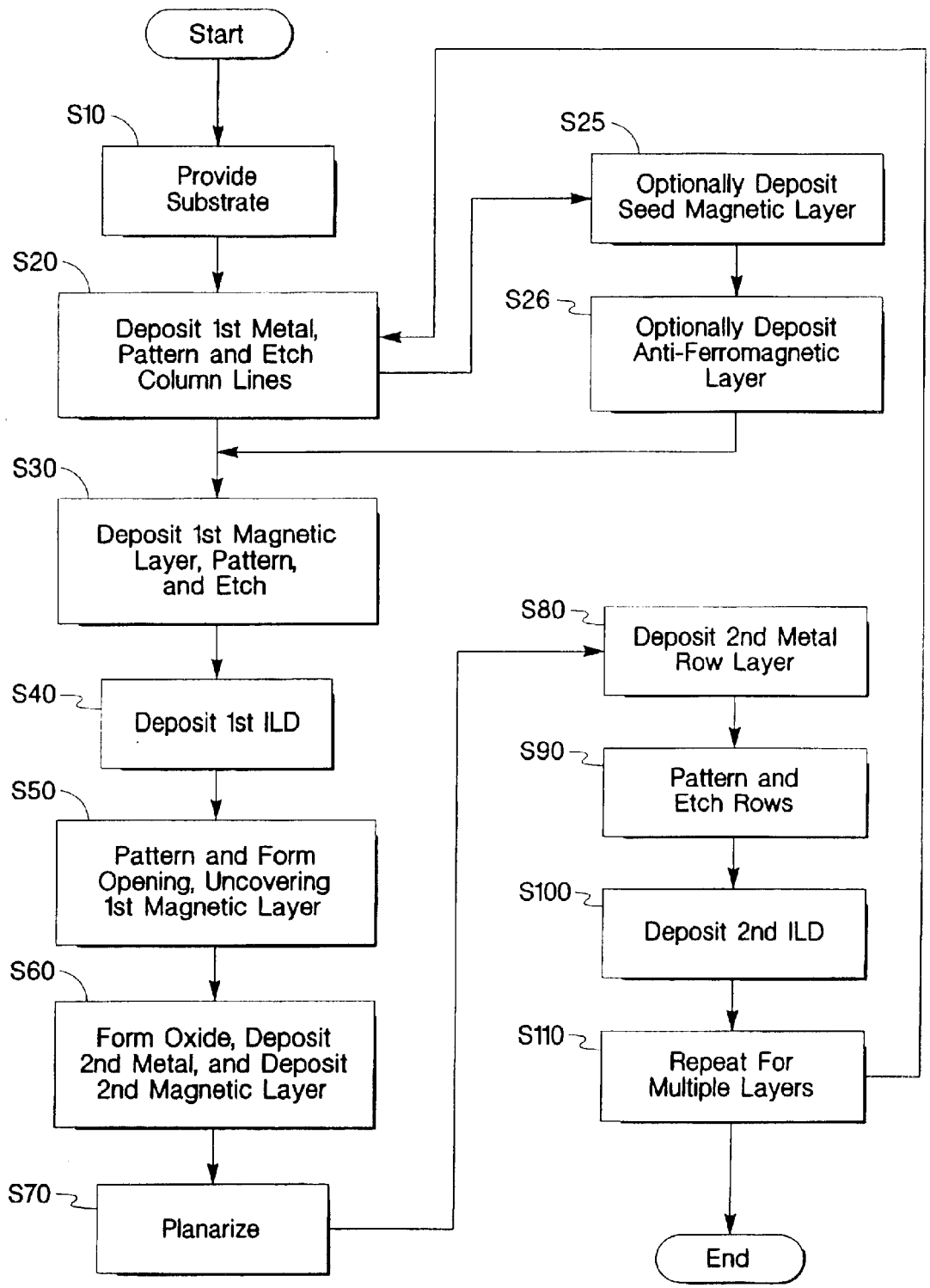
FIG. 8 is a flow chart illustrating a first embodiment of a method for fabricating a memory, performed in accordance with the invention.
Figure 9:
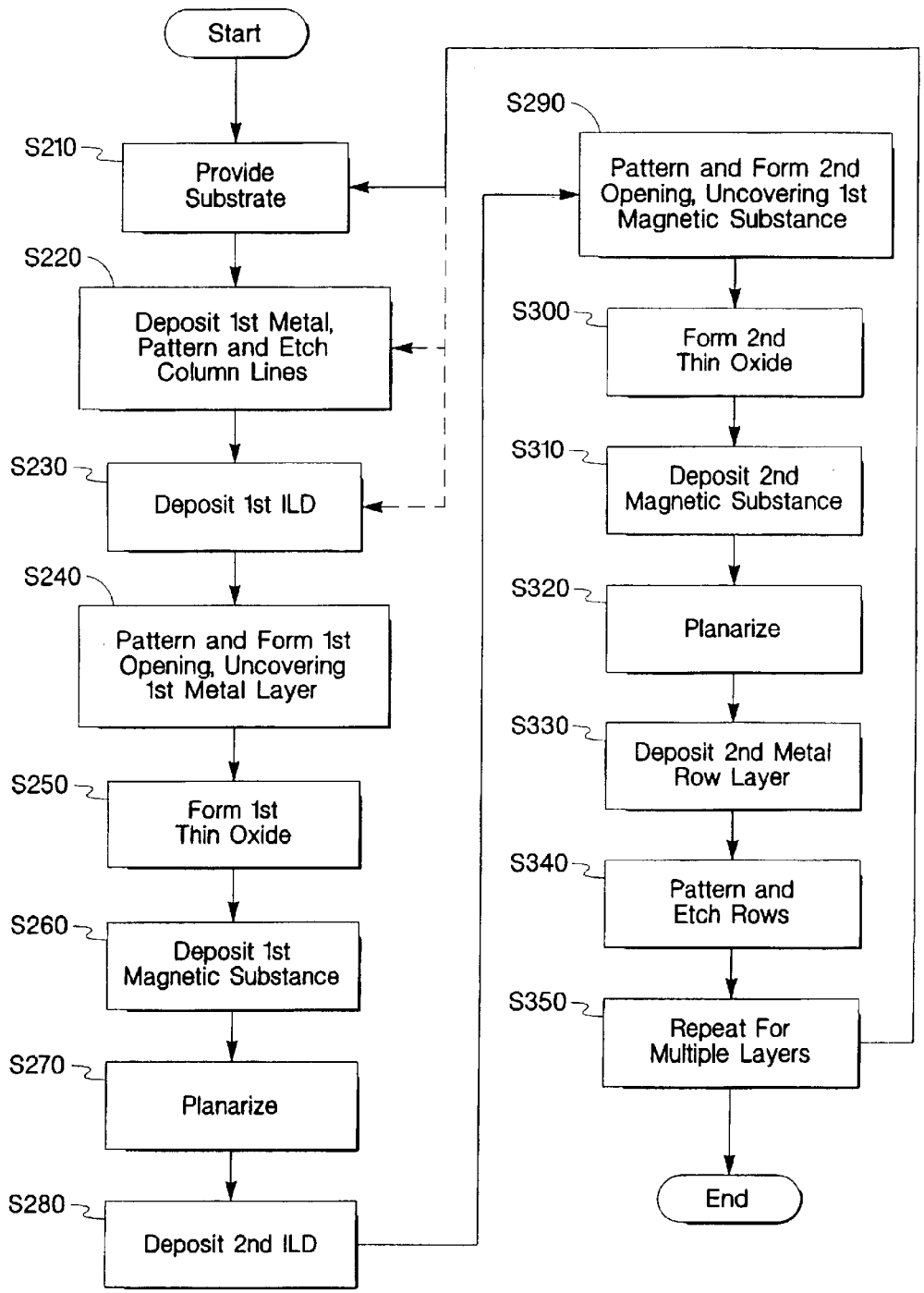
FIG. 9 is a flow chart illustrating a second embodiment of a method for fabricating a memory, performed in accordance with the invention.

A crosspoint memory array 10 may be fabricated by specially adapted fabrication methods of which various embodiments are illustrated by the flow charts of FIGS. 8 and 9. FIG. 8 includes some "optional" steps that are performed in some method embodiments but not in other embodiments, depending on the specific properties of materials used and on specific applications of the device. Various steps of the method embodiments are designated by reference numerals S10, S20, . . . , etc.

FIG. 8 is a flow chart illustrating a first embodiment of a method for fabricating a memory, performed in accordance with the invention. As shown in FIG. 8, such a method includes providing a suitable substrate 50 (step S10), depositing a first metal layer, and patterning and etching a first metal conductor (e.g., column lines 40) (step S20). In step S30, a first ferromagnetic layer 80 is deposited, patterned, and etched. A first interlayer dielectric (ILD) layer 35 is deposited in step S40. In step S50, an opening is patterned and formed, by etching a via opening 65 through the interlayer dielectric in at least partial alignment with the first metal conductor (e.g., column conductor 40), uncovering a portion of the first ferromagnetic layer 80, but not etching through the first ferromagnetic layer. In step S60, a thin tunnel-junction oxide layer 70 is formed over at least the portion of the first ferromagnetic layer that was uncovered in step S50, and second ferromagnetic layer 60 is deposited, at least filling the via opening. Thin tunnel-junction oxide layer 70 may be formed by directly depositing a thin oxide layer.

In step S60, depositing of second ferromagnetic layer 60 should be performed immediately after forming the thin tunnel-junction oxide layer 70, without exposing thin tunnel-junction oxide layer 70 to the atmosphere. To form thin tunnel-junction oxide layer 70, an intermediate metal layer may be deposited and oxidized.

In step S70, the resultant surface is planarized to the surface of the interlayer dielectric 35, e.g., by chemical-mechanical polishing (CMP). Step S80 is performed by depositing a second metal layer. Step S90 is performed by patterning and etching second metal conductor lines (e.g., row conductors 30) in at least partial alignment with the via opening 65 that was filled with the second ferromagnetic layer in step S60.

Up to this point, the method embodiment of FIG. 8 fabricates a single memory cell or, more practically, a memory comprising an array of memory cells (i.e., a single memory layer). All memory cells of the array are fabricated simultaneously. If additional memory layers are to be fabricated, a second interlayer dielectric (ILD) layer is deposited in step S100 and planarized if necessary to provide the substrate for the next memory layer, and the process is repeated (step S110) from step S20 as many times as needed to produce a stack having the desired number of layers. In repeating steps S20 through S90, row and column conductor lines may be alternated for each successive memory layer, and the second metal layer of the last memory level provides either row or column conductor lines for the last memory level as appropriate.

If seed magnetic layer 110 is to be included, optional step S25 is performed to deposit that layer. Similarly, if anti-ferromagnetic layer 100 is to be included, optional step S26 is performed to deposit that layer. In the method embodiment illustrated by FIG. 8, both steps S25 and S26 are performed between steps S20 and S30.

An integrated control element may be made by forming a tunnel-junction control element 75 in a via opening 65 before performing step S50 of depositing, patterning, and etching first ferromagnetic layer 80. In such a method, a second interlayer dielectric (ILD) is deposited, a second via opening is formed through the second ILD (the second via opening extending down to the first metal layer under the second ILD), and a thin tunnel-junction oxide layer is formed in the second via opening. This thin tunnel-junction oxide layer may be formed by oxidizing the first metal layer, e.g., by thermal oxidation of the first metal layer. Alternatively, the thin tunnel-junction oxide layer may be formed by depositing a thin oxide on the first metal layer. In another alternative method, the thin tunnel-junction oxide layer may be formed by depositing a thin intermediate metal layer and oxidizing the thin intermediate metal layer.

FIG. 9 is a flow chart illustrating a second embodiment of a method for fabricating a memory, performed in accordance with the invention. As shown in FIG. 9, this method embodiment includes step S210 of providing a suitable substrate. Step S220 consists of depositing a first metal layer and patterning and etching a first metal conductor (column conductor line 40). In step S230, a first interlayer dielectric (ILD) 35 is deposited. In step S240, a first via opening 65 is patterned and formed in at least partial alignment with the first metal conductor (column conductor line 40), by etching through first interlayer dielectric 35, uncovering a portion of the first metal conductor layer (column conductor line 40), but not etching through the first metal conductor layer. In step S250, a first thin tunnel-junction oxide layer 140 is formed over at least the portion of the first metal conductor that was uncovered in step S240.

The various options for tunnel-junction oxide formation step S250 are essentially the same as those described above in reference to FIG. 8, step S60. Thin tunnel-junction oxide layer 140 may be formed by directly depositing a thin oxide layer or by oxidizing first metal conductor (column conductor line 40). For example, the oxidation may be accomplished by thermal oxidation of the first metal conductor. In an alternate method for forming thin tunnel-junction oxide layer 140, a thin intermediate metal layer may be deposited and oxidized.

In step S260, a first ferromagnetic substance layer 80 is deposited, at least filling the first via opening 65. In step S260, depositing of first ferromagnetic layer 80 should be performed immediately after forming the thin tunnel-junction oxide layer 140, without exposing thin tunnel-junction oxide layer 140 to the atmosphere. The resultant surface is planarized to the surface of first interlayer dielectric (ILD) 35 (step S270). The planarization may be accomplished by conventional chemical-mechanical polishing (CMP). In step S280, a second interlayer dielectric (ILD) 35 is deposited. In step S290, a second via opening 65 is formed in at least partial alignment with the first ferromagnetic substance 80 in the first via opening by etching through the second ILD, thus exposing a portion of the first ferromagnetic substance 80. In step S300, a second thin tunnel-junction oxide layer 70 is formed over at least the portion of the first ferromagnetic substance exposed in step S290. The second thin tunnel-junction oxide layer 70 may be formed by oxidizing first ferromagnetic substance 80, e.g., by thermal oxidation. Alternatively, second thin tunnel-junction oxide layer 70 may be formed by depositing a thin intermediate metal layer and oxidizing the thin intermediate metal layer or by depositing a thin oxide upon first ferromagnetic substance 80.

A second ferromagnetic substance 60 is deposited, at least filling the second via opening (step S310). The resultant surface is planarized to the surface of second interlayer dielectric (ILD) 35 (step S320). Again, this planarization may be accomplished by conventional chemical-mechanical polishing (CMP).

A second metal layer is deposited (step S330), patterned, and etched (step S340) to provide second metal conductor lines (row conductors 30) in at least partial alignment with the second via opening filled with second ferromagnetic substance 60.

Again, up to this point, the method embodiment of FIG. 9 fabricates a single memory cell or, more practically, a memory comprising an array of memory cells (i.e., a single memory layer). All memory cells of the array are fabricated simultaneously. If additional memory layers are to be fabricated, the process is repeated (step 350) from step S210 as many times as needed to produce a stack having the desired number of layers. In repeating step S210, a third interlayer dielectric (ILD) layer is deposited and planarized if necessary to provide the substrate for the next memory layer. In repeating steps S220 through S340, row and column conductor lines may be alternated for each successive memory layer, and the second metal layer of the last memory level provides either row or column conductor lines for the last memory level as appropriate.

Those skilled in the art will understand that if a seed magnetic layer 110 and an anti-ferromagnetic layer 100 are to be included, optional steps like steps S25 and S26 of FIG. 8 (not shown in FIG. 9) are similarly performed at appropriate corresponding times to deposit those layers adjacent to ferromagnetic layers 60 and/or 80.

In the fabrication method embodiment illustrated in FIG. 9, there are various optional paths illustrated by dashed arrow segments for iterating subsets of process steps to produce a multilayer memory. Thus, for example, a multilayer memory having row and column conductor lines may be fabricated by performing steps S210 through S320 to form a first memory layer, repeating steps S220 through S320 (alternating row and column conductor lines for each successive memory layer) for each successive memory layer, and performing steps S330–S340 for the second metal layer of the last memory level, whereby the last metal conductor provides row or column conductor lines as required for the last memory level.

INDUSTRIAL APPLICABILITY

Although the foregoing has been a description and illustration of specific embodiments of the invention, various modifications and changes thereto can be made by persons skilled in the art without departing from the scope and spirit of the invention as defined by the following claims. For example, the order of process steps may be varied and configurations other than those shown in the drawings may be used. The order of layers in a memory cell may be reversed, for instance, to form a structure that is "upside down" relative to the embodiments illustrated. For another example, a hard magnet or a synthetic antiferromagnet may be used instead of the AF pinning layer. The AF pinning layer may be placed near the top of the stack instead of the bottom of the stack, whereby the top ferromagnetic layer is the pinned layer and the bottom ferromagnetic layer is the sense layer. The base material of the tunnel barrier is not limited to the materials described above. Other dielectrics and certain semiconductor materials may be used for the insulating tunnel barrier. Although the magnetic tunnel junctions have been described as SDT junctions, they are not so limited. The magnetic tunnel junctions may be Josephson junctions, for example.

What is claimed is:

1. A method for fabricating a memory cell, the method comprising the steps of:
   a) providing a substrate;
   b) depositing a first metal layer, and patterning and etching a first metal conductor,
   c) depositing, patterning, and etching a first ferromagnetic layer;
   d) depositing an interlayer dielectric (ILD), whereby an interlayer dielectric surface is formed;
   e) etching a via opening through the interlayer dielectric in at least partial alignment with the first metal conductor uncovering a portion of the first ferromagnetic layer,
   f) forming a tunnel-junction oxide layer over at least the uncovered portion of the first ferromagnetic layer,
   g) depositing a second ferromagnetic layer, at least filling the via opening, whereby a resultant surface is formed, wherein the step g) of depositing a second ferromagnetic layer is performed immediately after step f) of forming a tunnel-junction oxide layer, without exposing the tunnel-junction oxide layer to the atmosphere;
   h) planarizing the resultant surface to the interlayer dielectric surface; and
   i) depositing a second metal layer, and patterning and etching a second metal conductor in at least partial alignment with the via opening filled with the second ferromagnetic layer.

2. The method of claim 1, wherein the steps are performed in the order recited.

3. The method of claim 1, further comprising the step of depositing a seed magnetic layer over the first metal layer.

4. The method of claim 3, further comprising the step of depositing an anti-ferromagnetic layer over the seed magnetic layer.

5. A method for fabricating a multilayer memory having row and column conductor lines, the method comprising the steps of:

performing steps a) through i) of the method of claim 1 to form a first memory layer;

repeating steps b) through h), alternating row and column conductor lines for each successive memory layer until a desired number of memory layers is formed, thereby forming a last memory layer; and performing step i) for the second metal layer of the last memory layer, whereby the second metal layer of the last memory layer provides row or column conductor lines for the last memory layer.

6. The method of claim 1, wherein the step f) of forming a tunnel-junction oxide layer is performed by depositing an intermediate metal layer and oxidizing the intermediate metal layer.

7. The method of claim 1, wherein the step f) of forming a tunnel-junction oxide layer is performed by directly depositing an oxide layer.

8. The method of claim 1, further comprising the step of forming an integrated control element.

9. The method of claim 8, wherein the step of forming an integrated control element is performed by forming a tunnel-junction control element in a via opening before performing step c) of depositing, patterning, and etching a first ferromagnetic layer.

10. The method of claim 8, wherein the step of forming an integrated control element comprises the substeps of:

A) depositing a second interlayer dielectric (ILD);

B) forming a second via opening through the second interlayer dielectric (ILD), the second via opening extending down to the first metal layer under the second interlayer dielectric; and C) forming a tunnel-junction oxide layer in the second via opening.

11. The method of claim 10, wherein the substep C) of forming a tunnel-junction oxide layer is performed by oxidizing the first metal layer.

12. The method of claim 11, wherein the oxidizing of the first metal layer is performed by thermal oxidation of the first metal layer.

13. The method of claim 10, wherein the substep C) of forming a tunnel-junction oxide layer is performed by depositing an intermediate metal layer and oxidizing the intermediate metal layer.

14. The method of claim 10, wherein the substep C) of forming a tunnel-junction oxide layer is performed by depositing an oxide upon the first metal layer.

15. A method for fabricating a memory cell, the method comprising the steps of:

a) providing a substrate;

b) depositing a first metal layer, and patterning and etching a first metal conductor;

c) depositing a first interlayer dielectric (ILD) having a first-interlayer-dielectric surface;

d) etching a first via opening through the first interlayer dielectric in at least partial alignment with the first metal conductor, uncovering a portion of the first metal conductor;

e) forming a first tunnel-junction oxide layer over at least the uncovered portion of the first metal conductor;

f) depositing a first ferromagnetic substance, at least filling the first via opening and thereby forming a first resultant surface;

g) planarizing the first resultant surface to the first-interlayer-dielectric surface;

h) depositing a second interlayer dielectric (ILD) having a second-interlayer-dielectric surface;

i) etching a second via opening through the second interlayer dielectric in at least partial alignment with the first ferromagnetic substance in the first via opening, thus exposing a portion of the first ferromagnetic substance;

j) forming a second tunnel-junction oxide layer over at least the portion of the first ferromagnetic substance exposed;

k) depositing a second ferromagnetic substance, at least filling the second via opening and thereby forming a second resultant surface;

l) planarizing the second resultant surface to the second-interlayer-dielectric surface; and m) depositing a second metal layer, and patterning and etching a second metal conductor in at least partial alignment with the via opening filled with the second ferromagnetic substance.

16. The method of claim 15, wherein the step e) of forming a first tunnel-junction oxide layer is performed by oxidizing the first metal conductor.

17. The method of claim 16, wherein the oxidizing of the first metal conductor is performed by thermal oxidation of the first metal conductor.

18. The method of claim 15, wherein the step e) of forming a first tunnel-junction oxide layer is performed by depositing an intermediate metal layer and oxidizing the intermediate metal layer.

19. The method of claim 15, wherein the step e) of forming a first tunnel-junction oxide layer is performed by depositing an oxide upon the first metal conductor.

20. The method of claim 15, wherein the step j) of forming a second tunnel-junction oxide layer is performed by oxidizing the first ferromagnetic substance.

21. The method of claim 20, wherein the oxidizing of the first ferromagnetic substance is performed by thermal oxidation of the first ferromagnetic substance.

22. The method of claim 15, wherein the step j) of forming a second tunnel-junction oxide layer is performed by depositing an intermediate metal layer and oxidizing the intermediate metal layer.

23. The method of claim 15, wherein the step j) of forming a second tunnel-junction oxide layer is performed by depositing an oxide upon the first ferromagnetic substance.

24. The method of claim 15, further comprising the step of depositing a seed magnetic layer over the first metal layer.

25. The method of claim 24, further comprising the step of depositing an anti-ferromagnetic layer over the seed magnetic layer.

26. The method of claim 15, wherein the steps are performed in the order recited.

27. The method of claim 15, wherein the step f) of depositing a first ferromagnetic substance is performed immediately after step e) of forming a first tunnel-junction oxide layer, without exposing the first tunnel-junction oxide layer to the atmosphere.

28. The method of claim 15, wherein the step k) of depositing a second ferromagnetic substance is performed immediately after step j) of forming a second tunnel-junction oxide layer, without exposing the second tunnel-junction oxide layer to the atmosphere.

29. A method for fabricating a multilayer memory having row and column conductor lines, the method comprising the steps of:

performing steps a) through m) of the method of claim 15 to form a first memory layer;

repeating steps b) through l), alternating row and column conductor lines for each successive memory layer until a desired number of memory layers is formed, thereby forming a last memory layer; and performing step m) for the second metal layer of the last memory layer, whereby the second metal layer of the last memory layer provides row or column conductor lines for the last memory layer.

* * * * *